(12) United States Patent
Serizawa

(10) Patent No.: US 7,015,627 B2
(45) Date of Patent: Mar. 21, 2006

(54) PIEZOELECTRIC DEVICE AND MANUFACTURING METHOD THEREFOR

(75) Inventor: Satoshi Serizawa, Sagamihara (JP)

(73) Assignee: Seiko Epson Corporation, Tokyo (JP)

( * ) Notice: Subject to any disclaimer, the term of this patent is extended or adjusted under 35 U.S.C. 154(b) by 718 days.

(21) Appl. No.: 09/938,594

(22) Filed: Aug. 27, 2001

(65) Prior Publication Data

US 2004/0245896 A1 Dec. 9, 2004

(30) Foreign Application Priority Data

Sep. 6, 2000 (JP) ............................. 2000-270431

(51) Int. Cl.
  *H01L 41/053* (2006.01)
(52) U.S. Cl. ........................ 310/340; 310/348
(58) Field of Classification Search ............... 310/340, 310/344, 348
  See application file for complete search history.

(56) References Cited

U.S. PATENT DOCUMENTS

| | | | |
|---|---|---|---|
| 4,843,035 A * | 6/1989 | Takashima ................. 438/51 |
| 5,459,368 A * | 10/1995 | Onishi et al. ............ 310/313 R |
| 5,699,027 A * | 12/1997 | Tsuji et al. ................. 333/193 |
| 5,821,665 A * | 10/1998 | Onishi et al. ............ 310/313 R |
| 5,841,217 A * | 11/1998 | Kizaki et al. ............... 310/348 |
| 5,844,452 A | 12/1998 | Yamamoto et al. ......... 333/189 |
| 6,452,311 B1 * | 9/2002 | Serizawa ..................... 310/363 |
| 6,531,807 B1 * | 3/2003 | Tanaka et al. ............... 310/344 |

FOREIGN PATENT DOCUMENTS

| | | |
|---|---|---|
| JP | A-62-207008 | 9/1987 |
| JP | U-3-83665 | 8/1991 |
| JP | U-6-81136 | 11/1994 |
| JP | A-7-74581 | 3/1995 |
| JP | A-9-116047 | 5/1997 |
| JP | A-9-246904 | 9/1997 |
| JP | 10 256415 | 9/1998 |
| JP | 10 284975 | 10/1998 |
| JP | A-11-135659 | 5/1999 |
| JP | A-2000-22484 | 1/2000 |

\* cited by examiner

*Primary Examiner*—Thomas M. Dougherty
(74) *Attorney, Agent, or Firm*—Oliff & Berridge, PLC

(57) ABSTRACT

The invention provides a piezoelectric device having a structure which resists impact from the exterior of the device, and stress applied to a piezoelectric resonator element, and which can enhance electrical conductance between an electrode side of a package base and the piezoelectric resonator element, and to provide a manufacturing method therefor. A piezoelectric device having a structure in which a piezoelectric resonator element is bonded to electrodes provided on a package base, includes mounting electrodes, which are provided on the package base, to which a driving voltage is carried, via conduction paths, and on which the piezoelectric resonator element is mounted; and anchor members, which are disposed on the surfaces of the mounting electrodes, and which are formed of a material having superior adhesion to the surfaces thereof, in which the piezoelectric resonator element is bonded to these conductive anchor members with silicone-based conductive adhesives provided therebetween.

3 Claims, 10 Drawing Sheets

Fig. 8
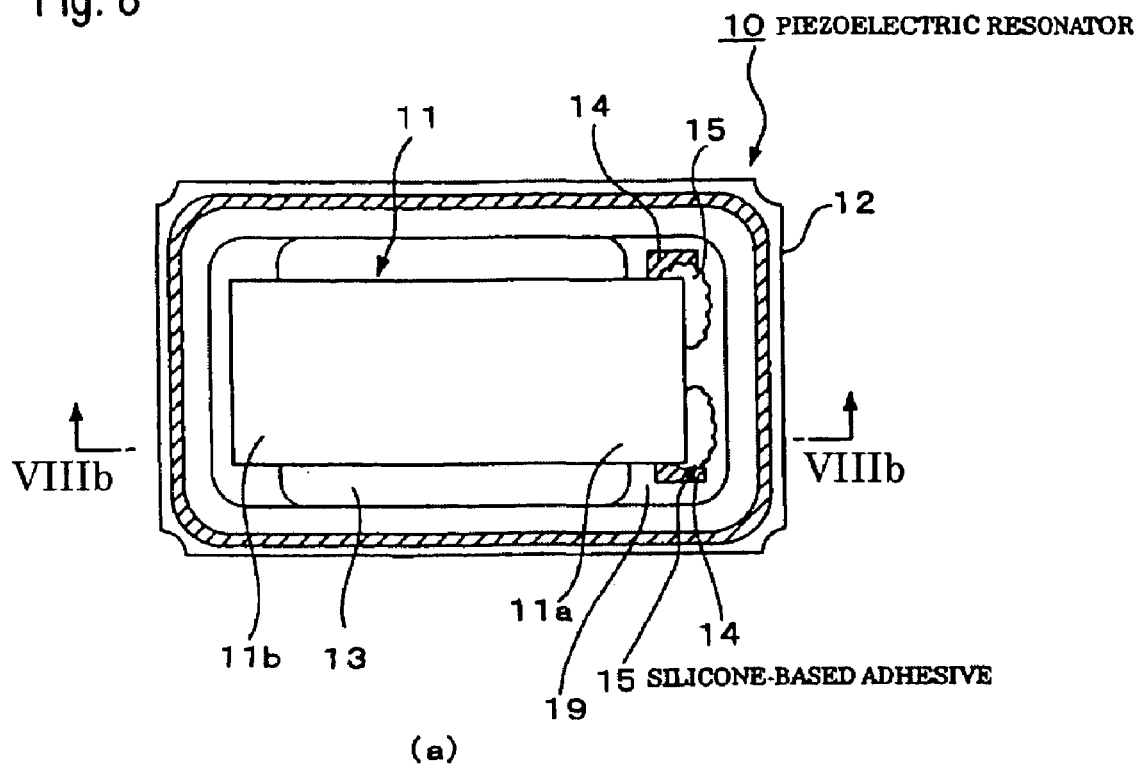
(a)
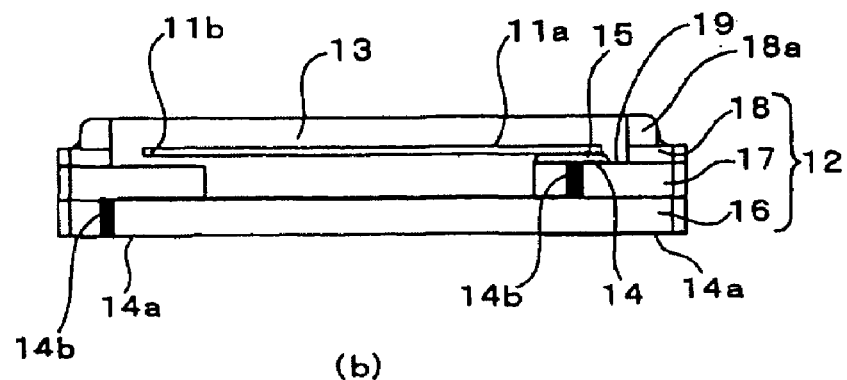
(b)

Fig. 12
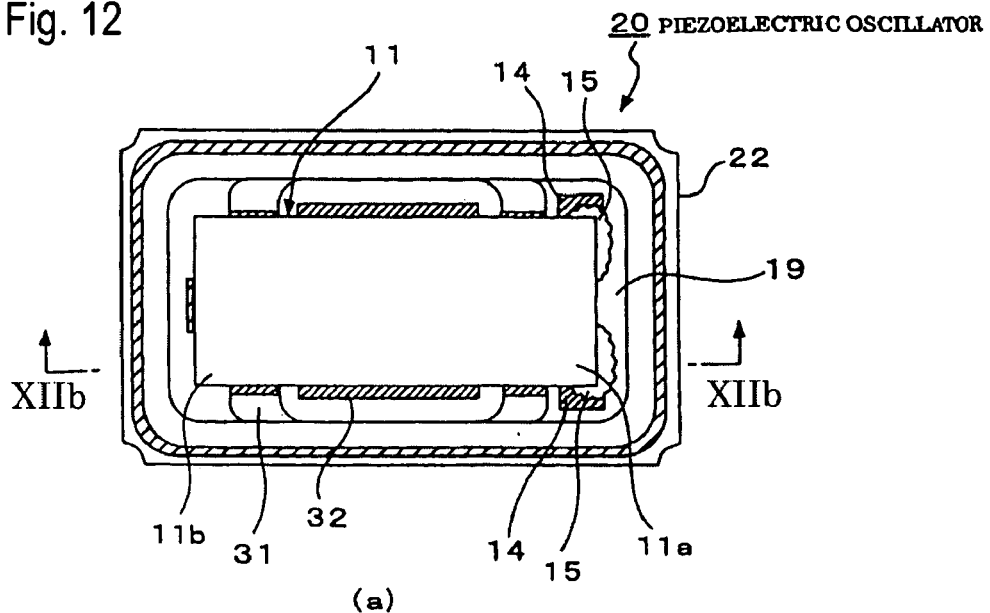
(a)
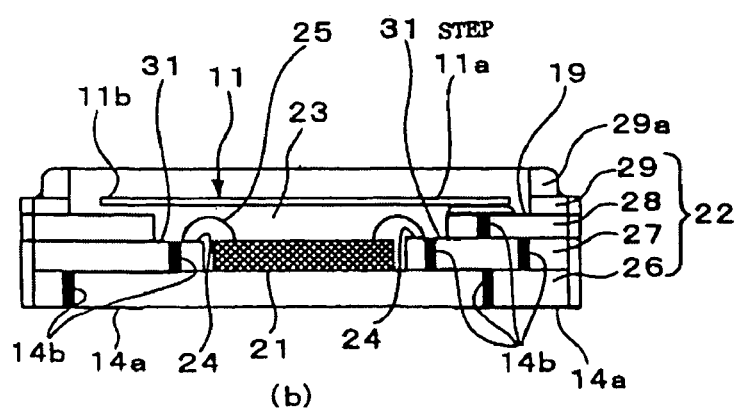
(b)

Fig. 13
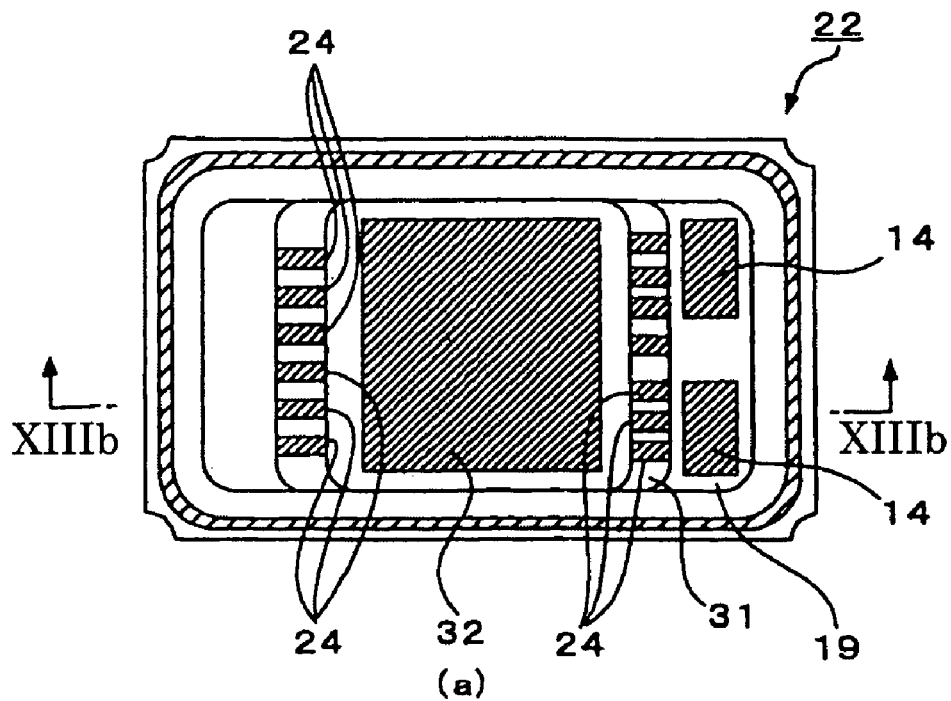
(a)
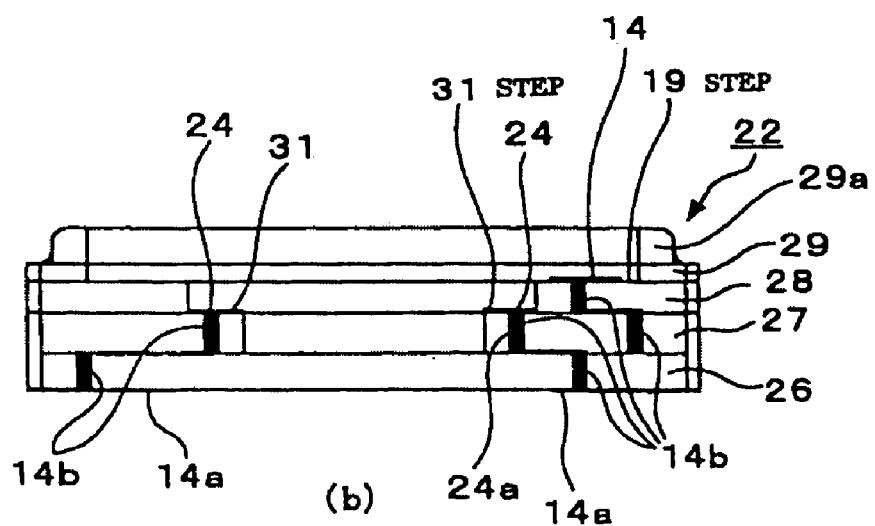
(b)

PIEZOELECTRIC DEVICE AND MANUFACTURING METHOD THEREFOR

BACKGROUND OF THE INVENTION

1. Field of Invention

The present invention relates to structures of piezoelectric devices, such as piezoelectric resonators or piezoelectric oscillators, having a piezoelectric resonator element received in a package. The present invention also relates to manufacturing methods therefor.

2. Description of Related Art

FIGS. 8(a) and 8(b) show an example of a conventional piezoelectric resonator, and for the convenience of understanding, a lid body thereof is omitted in the figures. FIG. 8(a) is a plan view showing the interior of the piezoelectric resonator by removing the lid body, and FIG. 8(b) is a schematic cross-sectional view showing the interior taken along plane VIIIb—VIIIb (shown in FIG. 8(a)) by removing the lid body.

In FIGS. 8(a) and 8(b), a piezoelectric resonator 10 has a package base 12 in the form of a box in which a space portion 13 is formed for accommodating a piezoelectric resonator element 11 in the form of a plate. One end 11a of the piezoelectric resonator element 11 is fixed on gold-plated electrodes 14 and 14, which are two mounting electrodes disposed on a step 19 formed in the space portion 13, by bonding with silicone-based conductive adhesives 15 and 15 provided therebetween, and the other end 11b is a free end.

In this structure, the piezoelectric resonator element 11 is formed of, for example, quartz crystal, and on the surface thereof, electrodes (not shown) are formed which apply a driving voltage to the quartz crystal for performing a predetermined oscillation. As a material, which is not shown in FIGS. 8(a) and 8(b), for sealing the package base 12, a metal, such as Koval, or a ceramic, such as alumina, is used.

As a material for the package base 12, a ceramic, such as alumina is used, and in the case shown in FIGS. 8(a) and 8(b), on a first base material 16 in the form of a flat plate, a second base material 17 having an opening formed therein is placed, and in addition, a third base material 18 having an opening formed therein, which is larger than the opening in the second base material, is placed thereon. Furthermore, on the third base material 18, a seam ring 18a is disposed. Accordingly, the package base 12 has a space portion 13 formed therein so that the piezoelectric resonator element 11 can be accommodated, and in addition, the step 19 is provided for bonding the piezoelectric resonator element 11 thereto.

The mounting electrodes 14 and 14 on the surface of the step 19 are connected to external terminals 14a exposed outside the package base 12, via conduction paths 14b, passing through the layered structure formed of the laminated base materials.

Accordingly, a driving voltage applied from the external terminals 14a is applied to electrodes formed on the surface of the piezoelectric resonator element 11, via the mounting electrodes 14 and 14, and the piezoelectric resonator element 11 oscillates at a predetermined frequency.

FIG. 9 is a flowchart generally showing steps of manufacturing the piezoelectric resonator 10 described above.

In FIG. 9, first, the package base 12 is formed by using a ceramic material, such as alumina, and the mounting electrodes 14 and 14 are formed by, for example, plating so as to correspond to the piezoelectric resonator element 11.

In the step described above, since the package base 12 is formed to have a laminated structure as described above, green sheets formed of ceramic materials corresponding to individual layers are formed, respectively, and are then laminated with each other, and firing is then performed.

For example, FIG. 10 shows a green sheet corresponding to the base material 17 for the second layer shown in FIGS. 8(a) and 8(b), and shows a state in which a plurality of the base materials 17 for the second layer are formed in one green sheet which is not cut yet. On the base material 17 for the second layer, for example, as shown in FIG. 10, the mounting electrode 14 in a state connected to the conduction path 14b is formed by electroplating or the like (a conduction path 14b, which also extends to another layer, may be formed in some cases). That is, after the individual layers are laminated with each other and are then fired, the seam ring 18a is brazed thereto, and gold electroplating is performed on the external terminals 14a. In this step, as described above, since the mounting electrode 14 is connected to the external terminal 14a via the conduction path 14b, the mounting electrode 14 and the conduction path 14b are formed by plating gold (Au) on a tungsten metalized underlying layer at exposed areas thereof which have been laminated.

FIGS. 11(a) and 11(b) show the package base 12 formed of the individual base materials laminated with each other. FIG. 11(a) is a plan view of the package base 12, and FIG. 11(b) is a schematic cross-sectional view taken along plane IIb—XIb (shown in FIG. 11(a)).

As shown in FIGS. 11(a) and 11(b), when the third base martial 18 is placed on the second base material 17, the conduction paths 14b are located below the third base material 18 and are almost covered therewith, and the two mounting electrodes 14 and 14, which have been plated with gold, are exposed on the step 19.

Next, after the seam ring is brazed to the third base material 18, gold plating is performed on the exposed mounting electrodes 14 and 14 described above.

Accordingly, only on the mounting electrodes 14 and 14 which are exposed is plated with gold, and the conduction paths passing through the layers are not plated with gold.

In addition, in FIG. 9, an excitation electrode and a connection electrode are formed by deposition on the piezoelectric resonator element 11, and silicone-based conductive adhesives 15 and 15 are applied to the mounting electrodes 14 and 14 on which the piezoelectric resonator element 11 is to be mounted (ST1).

Next, on the mounting electrodes 14 and 14 of the package base 12 in FIGS. 8(a) and 8(b), the piezoelectric resonator element 11 described above is fixed by bonding using the silicone-based conductive adhesives 15 and 15 as shown in FIGS. 8(a) and 8(b) (ST2).

Next, the package base 12 is placed in a heat curing oven, which in not shown in the figures, and the silicone-based conductive adhesives 15 and 15 are dried and cured (ST3). Subsequently, when the piezoelectric resonator element 11 is sufficiently fixed on the mounting electrodes 14 and 14 by the silicone-based conductive adhesives 15 and 15 provided therebetween, a driving voltage from the external terminals 14a is applied to the piezoelectric resonator element 11, via the conduction paths 14b, and the mounting electrodes 14 and 14, and while the oscillation frequency is monitored, the weights of the electrodes are reduced by, for example, irradiating laser light on the surface of the piezoelectric resonator element 11, whereby frequency adjustment is performed (ST4).

Next, the lid body, which is not shown in the figures, is placed on the package base 12, and sealing is performed by, for example, seam welding (ST5).

As described above, the piezoelectric resonator 10 is complete.

Most of the steps described above are commonly used for a piezoelectric oscillator, which is another piezoelectric device. That is, unlike the piezoelectric resonator, since the piezoelectric oscillator has an integrated circuit mounted in the package base, accordingly, the structure and the steps thereof are slightly different from those of the piezoelectric resonator.

FIGS. 12(a) and 12(b) show an example of a conventional piezoelectric oscillator, and for the convenience of understanding, a lid body thereof is omitted in the figures. FIG. 12(a) is a plan view showing the interior of the piezoelectric oscillator by removing the lid body, and FIG. 12(b) is a schematic cross-sectional view showing the interior taken along plane XIIb—XIIb (shown in FIG. 12(a)) by removing the lid body.

In FIGS. 12(a) and 12(b) described above, the same reference numerals of the elements of the piezoelectric resonator in FIG. 10 designate elements in these figures equivalent thereto, descriptions thereof are omitted, and the different points therebetween will be mainly described.

A piezoelectric oscillator 20 has a package base 22 in the form of a box in which a space portion 23 is formed for accommodating a piezoelectric resonator element 11 in the form of a plate. One end 11a of the piezoelectric resonator element 11 is fixed on gold-plated electrodes 14 and 14, which are two mounting electrodes disposed on a step 19 formed in the space portion 23, by bonding using silicone-based conductive adhesives 15 and 15 provided therebetween, and the other end 11b is a free end.

The package base 22 is formed by laminating four base materials 26, 27, 28, and 29 formed of a ceramic, the base material 26 located at the bottom is in the form of a flat plate, and the base materials 27, 28, and 29 placed thereon are formed of ring-shaped or frame-shaped materials having the inside diameters which are increased in this order. Accordingly, the space portion 23 is formed inside the package base 22 so that the piezoelectric resonator element 11 is accommodated therein, and in addition to the step 19 for bonding the piezoelectric resonator element 11 thereto, a second step 31 is formed at an even lower place.

The mounting electrodes 14 and 14 on the step 19 are connected to an integrated circuit 21 via conduction paths 14b passing through the laminated structure formed of the laminated base materials.

In addition, on the bottom inside the package base 22, the integrated circuit 21 is mounted, and on the step 31, a plurality of electrodes 24, which are to be wire-bonded to this integrated circuit 21 by gold wires 25, is formed. Since some of the electrodes 24 and the mounting electrodes 14 and 14 are connected to each other via the conduction paths 14b, the mounting electrodes 14 and 14 will also be plated with gold.

FIGS. 13(a) and 13(b) show the arrangement of the individual electrodes by showing the package base 22 formed of the laminated individual base materials. FIG. 13(a) is a plan view of the package base 22, and FIG. 13(b) is a schematic cross-sectional view taken along plane XIIIb—XIIIb (shown in FIG. 13(a)).

As shown in FIGS. 13(a) and 13(b), on the step 19, the mounting electrodes 14 and 14 are formed, and on the step 31, the plurality of electrodes 24, which are to be wire-bonded, is formed. In addition, on the inside bottom surface, an electrode 32 for mounting the integrated circuit 21 is provided. Methods for forming these electrodes are equivalent to those described for the piezoelectric resonator 10.

Consequently, in the piezoelectric oscillator 20, when a driving voltage applied from the integrated circuit 21 is applied to the electrodes formed on the surface of the piezoelectric resonator element 11, via the mounting electrodes 14 and 14, the piezoelectric resonator element 11 oscillates at a predetermined frequency, and an output signal therefrom is inputted to the integrated circuit 21, whereby an external signal having a predetermined frequency can be obtained.

In this connection, the conventional piezoelectric device has a problem described below.

Since this problem is a basically common problem for the piezoelectric resonator 10 and the piezoelectric oscillator 20, the problem concerning the piezoelectric resonator 10 will be described.

As described in FIGS. 8(a), 8(b), 10, 11(a) and 11(b), in the conventional piezoelectric resonator 10, the mounting electrodes 14 and 14 are connected to the external terminals 14a (the electrodes 24 to be wire-bonded in the piezoelectric oscillator 20) via the conduction paths 14b.

The external terminals 14a and the electrodes 24 are advantageously gold plated, as in the structure described above, in order to ensure solder wettability and in view of bonding characteristics or oxidation resistance, and the mounting electrodes 14 and 14 connected thereto are also simultaneously gold plated.

In addition, the electrodes of the piezoelectric resonator element 11 are bonded to the mounting electrodes 14 and 14 using the silicone-based conductive adhesives 15 and 15. Accordingly, a driving voltage applied from the outside is to be carried to the piezoelectric resonator element 11.

The silicone-based conductive adhesive 15 is used for the following reasons. That is, in the case in which the piezoelectric resonator 10 and the piezoelectric oscillator 20 are subject to conditions of varying temperature, when a conductive adhesive formed of a rigid resin, such as an epoxy-based or a polyimide-based resin, is used instead of the silicone-based conductive adhesive, and when a difference in expansion and contraction is generated between the piezoelectric resonator element 11 and the package base 12, the adhesive formed of the rigid resin described above cannot absorb the difference, and stress is applied to the piezoelectric resonator element 11, whereby degradation of characteristics, such as a change in frequency, an increase in CI (crystal impedance), or the like may occur in some cases.

In addition, in the case in which the piezoelectric resonator 10 or the piezoelectric oscillator 20 is mounted on a mounting substrate or the like, when a deforming effect caused by an external force is applied thereto and is transferred to the piezoelectric resonator element 11, via the adhesive, it is considered that the same phenomenon as described above may occur.

Accordingly, as described above, the electrodes of the piezoelectric resonator element 11 are bonded to the mounting electrodes 14 and 14 using the relatively soft silicone-based conductive adhesives 15 and 15. Since this silicone-based conductive adhesive is relatively soft, the difference in expansion and contraction and the deforming effect can be satisfactory reduced, and in addition, since a silver filler is contained in the silicone-based conductive adhesive, the electrical conductance can be obtained.

However, the silicone-based conductive adhesive 15 has a problem in that adhesive strength thereof adhered to the gold component in the mounting electrode is low.

That is, gold is an inert metal, is unlikely to be oxidized, and has an insufficient bonding force to a resin used for the adhesive. In addition to this, since the shrinkage of the silicone-based conductive adhesive is low when cured by heating (ST3 in FIG. 9), the silver filler component contained therein has a weak force penetrating into the surface of the gold on the mounting electrode 14, and hence, an electrical conductance defect may occur in some cases. Furthermore, the silicone-based conductive adhesive 15 may form a resinous layer at the interface with the gold in some cases, and as a result, the electrical conductance defect may also occur in some cases.

SUMMARY OF THE INVENTION

An object of the present invention is to provide a piezoelectric device having a structure which can solve the problems described above, which resists impact from the exterior of the device and stress applied to the piezoelectric resonator element, and which can enhance the electrical conductance between the electrode side of the package base and the piezoelectric resonator element.

According to the invention, the object described above can be achieved by a piezoelectric device having a structure in which a piezoelectric resonator element is bonded to electrodes provided in a package base. The piezoelectric device described above includes mounting electrodes which are provided in the package base, to which a driving voltage is carried via conduction paths, and on which the piezoelectric resonator element is mounted; and conductive anchor members which are disposed on the surfaces of the mounting electrodes and which are formed of a material having superior adhesion to the surfaces of the mounting electrodes. The piezoelectric resonator element is bonded to the conductive anchor members with silicone-based conductive adhesives provided therebetween.

According to this structure, since the mounting electrodes are provided with the anchor members on the surfaces thereof, when the silicone-based conductive adhesives are applied over the anchor members, the adhesive strength is enhanced compared to the conventional case in which the silicone-based conductive adhesives are directly applied over the surfaces of the electrodes. In this connection, the anchor member is a member mainly having a roughened surface or a finely irregular surface, and a member which serves to enhance an anchor effect of an adhesive. As a result, the silicone-based conductive adhesive is not adhered to a conventional electrode surface having poor adhesion and instead is adhered to, for example, the surface of the anchor member having an irregularity thereon. In the case described above, since the silicone resin penetrates into the fine irregularity of the anchor member, the adhesive strength thereof is enhanced, and in addition, since a silver filler contained in the adhesive penetrates into the fine irregularity of the anchor member, the electrical conductance is also enhanced.

According to another aspect of the invention, the anchor members include a conductive adhesive composed of a rigid resin.

According to another aspect of the invention, the anchor members include an epoxy-based or a polyimide-based conductive adhesive.

In addition, according to another aspect of the invention, the object described above can also be achieved by a method for manufacturing a piezoelectric device including a bonding step of bonding a piezoelectric resonator element to electrodes provided on the package base. The bonding step includes: moving a jig in a direction substantially perpendicular to a surface of a mounting electrode, which is provided on the package base and to which a voltage is carried via a conduction path, so that the jig is brought into contact with the surface of the mounting electrode, the jig having at a tip thereof a conductive adhesive adhered thereto, the conductive adhesive having superior adhesion to a material of the surface of the electrode; subsequently separating the jig therefrom in the perpendicular direction so as to form an anchor member on the surface of the mounting electrode; and placing the piezoelectric resonator element on the anchor member provided with a silicone-based conductive adhesive thereon so as to be bonded thereto.

According to this method, the bonding step in the manufacturing steps of the piezoelectric device is performed such that, when the jig provided with the conductive adhesive, having superior adhesion to the material for the surface of the electrode, at the tip thereof, is moved in the direction approximately perpendicular to the surface of the electrode and is brought into contact with the surface of the mounting electrode, the conductive adhesive, in the form of a paste, is transferred from the tip of the jig to the mounting electrode which is contacted therewith. Subsequently, by separating the jig therefrom in the perpendicular direction, the anchor member is formed on the surface of the mounting electrode. That is, when the jig is separated in the perpendicular direction described above, during the separation, at the surface of the conductive adhesive, which has superior adhesion to the material forming the electrode surface, the conductive adhesive stands finely in the direction in which it is pulled, and hence, an anchor member having a rough surface or a finely irregular surface can be formed.

Accordingly, as a result, the silicone-based conductive adhesive is not adhered to a conventional electrode surface having poor adhesion, and instead is adhered to, for example, the surface of the anchor member having an irregularity thereon. In the case described above, since the silicone resin penetrates into the fine irregularity of the anchor member, the adhesive strength thereof is enhanced, and in addition, since a silver filler contained in the adhesive penetrates into the fine irregularity of the anchor member, the electrical conductance is also enhanced.

According to an aspect of the invention, in the method described above, the conductive adhesive adhered to the jig is a conductive adhesive including a rigid resin.

According to another aspect of the invention, in the method described above, the conductive adhesive adhered to the jig is an epoxy-based or a polyimide-based conductive adhesive. According to another aspect of the invention, in the method described above, the jig is a stamping jig.

BRIEF DESCRIPTION OF THE DRAWINGS

FIGS. 1(a) and 1(b) show a piezoelectric resonator according to a preferable embodiment of the present invention, in which FIG. 1(a) is a plan view showing the interior of the piezoelectric resonator by removing a lid body thereof, and FIG. 1(b) is a schematic cross-sectional view showing the interior taken along plane Ib—Ib (shown in FIG. 1(a)) by removing the lid body;

FIGS. 5(a) and 5(b) show a manner in which the anchor member is formed on the mounting electrode of the piezoelectric resonator shown in FIGS. 1(a) and 1(b), in which FIG. 5(a) shows a way of stamping performed by a jig, and FIG. 5(b) is an expanded partially cross-sectional view of the vicinity of the mounting electrodes;

FIGS. 6(a) and 6(b) show a piezoelectric oscillator according to a preferable second embodiment of the present invention, in which FIG. 6(a) is a plan view showing the interior of the piezoelectric oscillator by removing a lid body thereof, and FIG. 6(b) is a schematic cross-sectional view showing the interior taken along plane VIb—VIb (shown in FIG. 6(a)) by removing the lid body;

FIGS. 8(a) and 8(b) show a conventional piezoelectric resonator, in which FIG. 8(a) is a plan view showing the interior of the piezoelectric oscillator by removing a lid body thereof, and FIG. 8(b) is a schematic cross-sectional view showing the interior taken along plane VIIIb—VIIIb (shown in FIG. 8(a)) by removing the lid body;

FIGS. 11(a) and 11(b) show a package base formed of laminated individual base materials of the piezoelectric resonator shown in FIGS. 8(a) and 8(b), in which FIG. 11(a) is a plan view of the package base, and FIG. 11(b) is a schematic cross-sectional view taken along plane XIb—XIb (shown in FIG. 11(a));

FIGS. 12(a) and 12(b) show a conventional piezoelectric oscillator, in which FIG. 12(a) is a plan view showing the interior of the piezoelectric oscillator by removing a lid body thereof, and FIG. 12(b) is a schematic cross-sectional view taken along plane XIIb—XIIb (shown in FIG. 12(a)) by removing the lid body;

FIGS. 13(a) and 13(b) show a package base formed of laminated individual base materials of the piezoelectric oscillator shown in FIGS. 12(a) and 12(b), in which FIG. 13(a) is a plan view of the package base, and FIG. 13(b) is a schematic cross-sectional view taken along plane XIIIb—XIIIb (shown in FIG. 13(a)).

DETAILED DESCRIPTION OF PREFERRED EMBODIMENTS

Hereinafter, preferred embodiments of the present invention will be described with reference to the drawings.

First Embodiment

Figure 1:
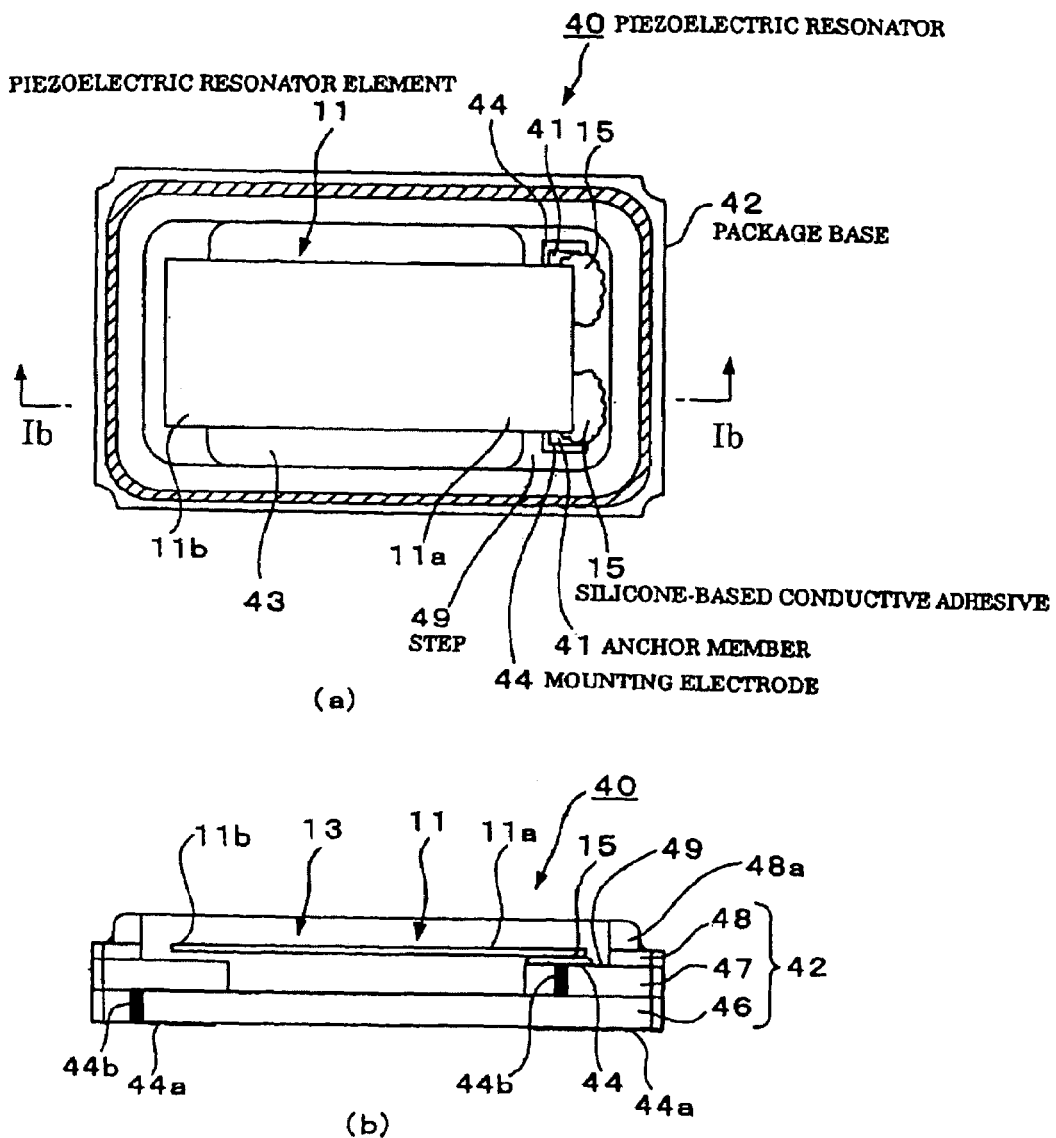

FIGS. 1(a) and 1(b) show a piezoelectric resonator as an example of a piezoelectric device to which the present invention is applied.

In FIGS. 1(a) and 1(b), for the convenience of understanding, a lid body is omitted in the figures. FIG. 1(a) is a plan view showing the interior of the piezoelectric resonator by removing the lid body, and FIG. 1(b) is a schematic cross-sectional view showing the interior taken along plane Ib—Ib (shown in FIG. 1(a)) by removing the lid body.

In FIGS. 1(a) and 1(b), a piezoelectric resonator 40 has a package base 42, in the form of a box, in which a space portion 43 is formed that accommodates a piezoelectric resonator element 11 in the form of a plate. One end 11a of the piezoelectric resonator element 11 is fixed on two mounting electrodes 44 and 44, disposed on a step 49 formed in the space portion 43, by bonding using silicone-based conductive adhesives 15 and 15 provided therebetween, and the other end 11b is a free end.

In this structure, the piezoelectric resonator element 11 is formed of, for example, quartz crystal, and on the surface thereof, electrodes (not shown) are formed which apply a driving voltage on the quart crystal to perform a predetermined oscillation. As a material for the lid body, which is not shown in the figures, to seal the package base 42, a metal, such as Koval, or a ceramic, such as alumina, is used.

As a material for the package base 42, a ceramic such as alumina is used. In the case shown in FIGS. 1(a) and 1(b), on a first base material 46 in the form of a flat plate, a second base material 47 having an opening formed therein is placed, a third base material 48 having an opening formed therein, which is larger than the opening in the second base material, is placed thereon, and on the third base material, a seam ring 48a is disposed. Accordingly, the package base 42 has the space portion 43 formed therein so that the piezoelectric resonator element 11 can be accommodated, and in addition, the step 49 is formed to bond the piezoelectric resonator element 11 thereto.

The mounting electrodes 44 and 44 on the surface of the step 49 are formed by, for example, steps of forming tungsten metalized layers as underlying layers, and forming electrode films thereon formed of, for example, gold (Au). In addition, on the surfaces of the gold, anchor members 41 and 41 (refer to FIG. 1(a)) are formed as described below.

For these anchor members 41 and 41 in this embodiment, as a conductive adhesive formed of a rigid resin, a material is preferably used which is formed of, for example, an epoxy-based or a polyimide-based resin containing a silver filler or the like as a conductive material for imparting electrical conductance.

The mounting electrodes 44 and 44 are connected to conduction paths 44b passing through the laminated structure formed of the laminated base materials, and are connected to external terminals 44a exposed on the outside of the package base 42.

Next, in addition, the piezoelectric resonator element 11 is mounted on the anchor members 41 and 41 provided on the mounting electrodes 44 and 44 by using silicone-based conductive adhesives 15 and 15 provided therebetween.

Since the silicone-based conductive adhesive 15 is used, in the case in which the piezoelectric resonator 40 is subjected to conditions of varying temperature, when a difference in expansion and contraction is generated between the piezoelectric resonator element 11 and the package base 42, the difference described above can be appropriately absorbed. Consequently, even when a difference in expansion and contraction is generated, and stress is applied to the piezoelectric resonator element 11, there is not a risk in which degradation of characteristics occurs, such as a change in frequency, an increase in CI (crystal impedance) or the like.

In addition, in the case in which the piezoelectric resonator 40 is mounted on a mounting substrate or the like, when a deforming effect caused by an external force is applied thereto and is transferred to the piezoelectric resonator element 11, via the adhesive, since the deforming effect is not directly transferred to the piezoelectric resonator element 11, the stress being applied to the piezoelectric resonator element 11 can be prevented as is the case described above.

The silicone-based conductive adhesives 15 and 15 are relatively soft and have a buffer effect of preventing vibration from the outside from being directly transferred to the piezoelectric resonator element 11, and the silver filler is contained in the silicone-based conductive adhesive, whereby electrical conductance can be obtained.

Accordingly, a driving voltage applied from the external terminals 44*a*, which is external electrodes, is carried to the mounting electrodes 44 and 44, via the conduction paths 44*b*, and in addition, the driving voltage is applied to the piezoelectric resonator element 11 via the silicone-based conductive adhesives 15 and 15. As a result, the piezoelectric resonator element 11 oscillates at a predetermined frequency.

Figure 2:
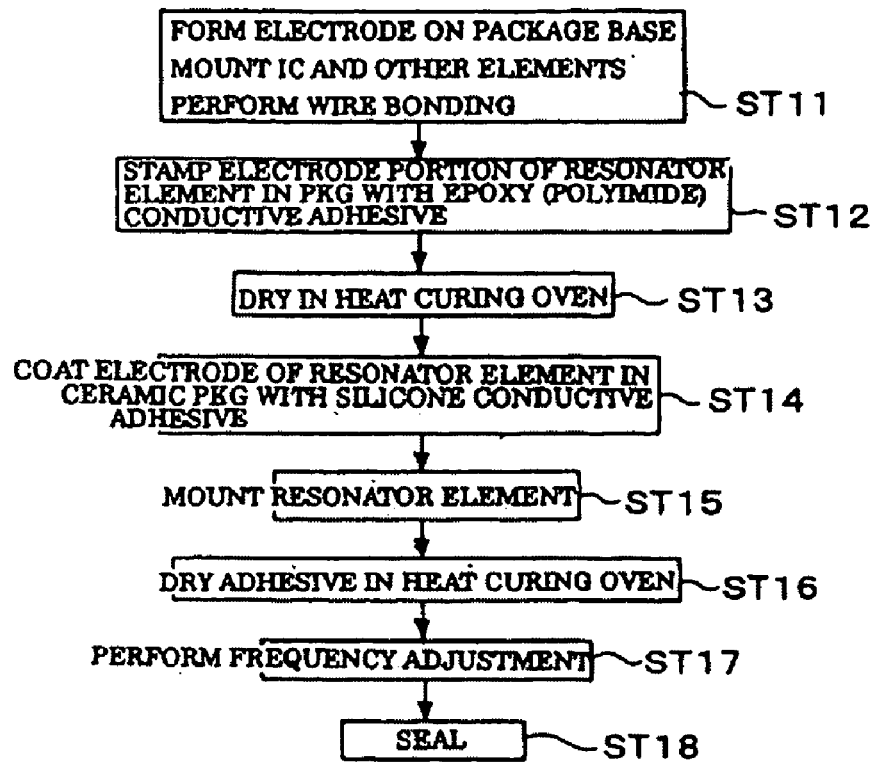
FIG. 2 is a flowchart briefly showing manufacturing steps of the piezoelectric resonator shown in FIG. 1.

FIG. 2 is a flowchart generally showing steps of manufacturing the piezoelectric resonator 40 described above.

In FIG. 2, first, the package base 42 is formed using a ceramic material, such as alumina, and the mounting electrodes 44 and 44 and the like are formed at positions corresponding to the piezoelectric resonator element 11 (ST11).

In the step described above, since the package base 42 is formed to have the laminated structure as described above, green sheets formed of ceramic materials corresponding to individual layers are formed, respectively, are laminated with each other, and are then fired.

Figure 3:
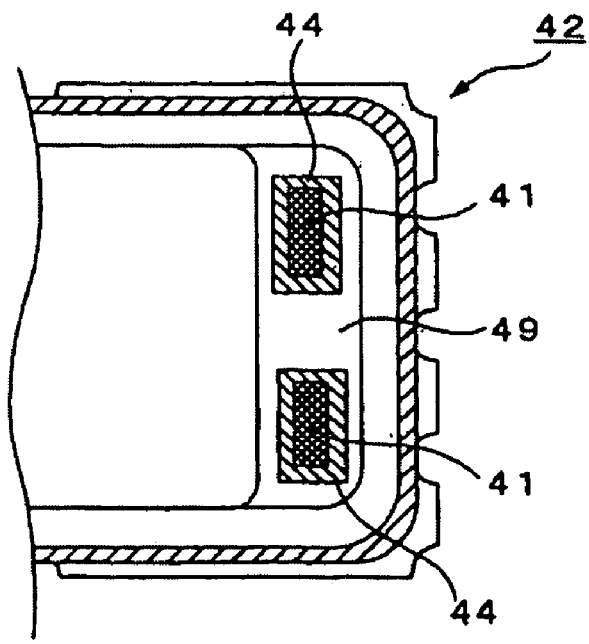
FIG. 3 is an expanded partial front view showing the vicinity of mounting electrodes of a package base of the piezoelectric resonator shown in FIG. 1.

Next, on the surfaces of the mounting electrodes 44 and 44, the anchor members 41 are formed. In this connection, when a piezoelectric oscillator is formed among the piezoelectric devices, mounting of an integrated circuit (IC) and other components is also performed (ST12). FIG. 3 is an expanded partial front view showing the vicinity of the mounting electrodes 44 and 44 of the package base 42, and in this embodiment, the anchor members 41 and 41 are applied to the central portions of the surfaces of the individual mounting electrodes 44 and 44.

A method for forming the anchor members 41 and 41 will be described in detail.

Figure 4:
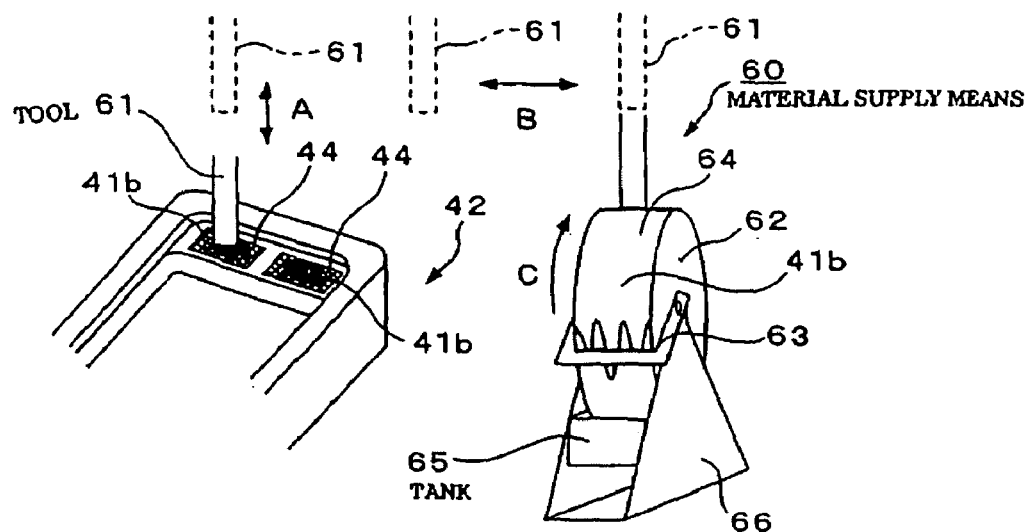
FIG. 4 shows steps of manufacturing an anchor member on the mounting electrode of the piezoelectric resonator shown in FIG. 1.

FIG. 4 shows actual steps of forming the anchor members 41 and 41. In FIG. 4, the formation of the anchor members 41 and 41 is performed by using a system including a material supply device 60 for the anchor member and a dedicated jig 61.

The material supply device 60 has a base portion 66 in the form of a pedestal which is a supporting portion, the base portion 66 is provided with a tank 65 which is a reservoir having an open end at the upper side thereof, and the tank 65 stores a material for the anchor members 41 and 41 therein. That is, the material for the anchor members 41 and 41 is a melted adhesive having a certain level of viscosity and in particular, preferably has good adhesion to a surface material forming the mounting electrodes 44 and 44, i.e., to gold (Au) in this embodiment. Accordingly, in this embodiment, a conductive adhesive formed of a rigid resin is preferably selected as the material for the anchor members 41 and 41, and in particular, an epoxy-based or a polyimide-based conductive adhesive is used.

A roller 62 is disposed above the tank 65, the roller 62 is located at a place intruding into a part of the tank 65 from the open end thereof and is supported in a rotatable manner in the direction indicated by the arrow C, and rotatable round surface 64 of the roller 62 is disposed so as to be brought into contact with a liquid surface of the material stored in the tank 65.

Consequently, when the roller 62 is rotated, a material 41*b* is adhered to the surface of the roller 62 so as to form a thin film. Accordingly, when the viscosity of the material is too high, the amount of the material adhered to the round surface of the roller 62 is increased, and hence, the viscosity thereof is controlled to be relatively low. In addition, it is preferable if at least the round surface of the roller 62 does not have an entirely flat surface and a cellular material, such as a porous material, is used therefor, because an adhesive 41*b* having a low viscosity easily adheres thereto.

More preferably, a squeegee 63 is provided in contact with the rotatable round surface 64 of the roller 62, and an unnecessarily large quantity of the material supplied from the tank 65, which is adhered to the round surface 64 of the roller 62, is scraped away therefrom by rotating the roller 62 in the direction indicated by the arrow, whereby a material having a predetermined thickness can be adhered to the round surface 64.

The dedicated jig 61 can be at least moved up and down in the direction indicated by the arrow A in FIG. 4 and moved in the direction indicated by the arrow B so as to move between above the roller 62 of the material supply device 60 and above the mounting electrodes 44 and 44 of the package base 42 which are to be processed. In order to realize the structure described above, for example, an arm device having a part-chucking jig, which is used in a mounting machine to mount electronic parts, at the tip thereof, may be employed.

Figure 5:
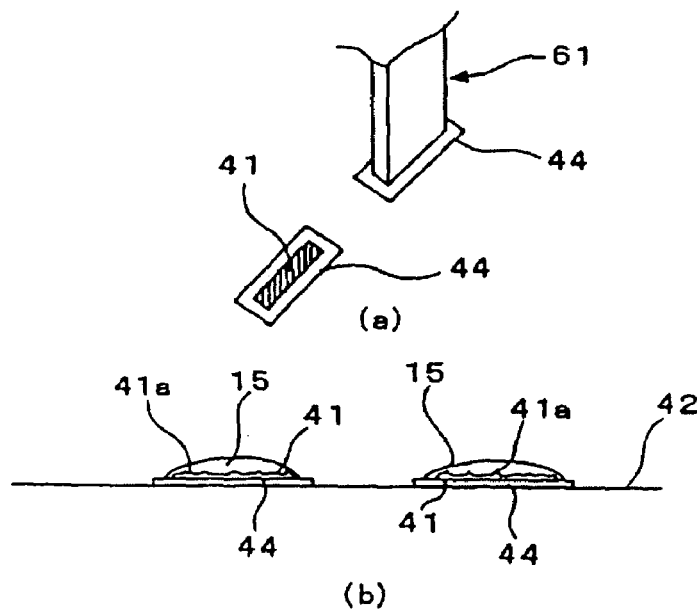

In addition, the dedicated jig 61 is formed into, for example, a shape as shown in FIG. 5(*a*) at least having a flat surface at the tip thereof, which is smaller than the size of the mounting electrode 44, and it is preferable if this tip portion is formed of a cellular material, such as a porous material or the like, because the adhesive 41*b* having a relatively low viscosity easily adheres thereto.

Since the material supply device 60 and the dedicated jig 61 are formed as described above, for example, as shown in FIG. 4, when the dedicated jig 61 is located above the material supply device 60, the jig 61 is moved up and down in the vertical direction so that the tip thereof is brought into contact with the round surface 64 of the roller 62, whereby the adhesive 41*b* is adhered to the jig.

Next, the dedicated jig is then moved in the direction indicated by the arrow B so as to be located above the package base 42. While the dedicated jig is in the state mentioned above, for example, it is preferable that, by a control in accordance with information supplied from an image processing device, which is not shown, the individual positions of the mounting electrodes 44 and 44 be detected and that the dedicated jig be then moved thereover. The dedicated jig 61 in the state described above then travels down along the direction indicated by the arrow A, and the tip to which the adhesive is adhered is brought into contact with the surface of the mounting electrode 44 in the direction perpendicular thereto. Next, the dedicated jig travels up in the direction approximately perpendicular to the surface of the mounting electrode 44, whereby it is separated from the electrode.

Movement or operation of the dedicated jig 61 described above works similarly to a stamping operation as a whole, specifically a thin conductive adhesive adhered to the round surface 64 of the roller 62 is transferred to the tip of the dedicated jig 61, the adhesive is then adhered to the surface of the mounting electrode 44 by bringing the tip of the jig into contact with the surface of the mounting electrode 44 in a manner similar to that in which stamping is performed, and the dedicated jig 61 is separated therefrom along the vertical direction, whereby the anchor members 41 and 41 are formed, for example, as shown in the expanded partially cross-sectional view in FIG. 5(*b*). That is, when the dedicated jig 61 is separated along the vertical direction, a conductive adhesive material at the surface thereof stands during separation in the direction in which dedicated jig is separated, i.e., in the direction in which the material is pulled, whereby anchor members 41 and 41 having rough surfaces or finely irregular surfaces 41a are formed.

Next, in a state in which the adhesive 41b, which is to be formed into the anchor members 41 and 41, is applied to the surfaces of the mounting electrodes 44 and 44, the package base 42 is heated in a heat curing oven so as to be dried and cured (ST13).

As a result, the adhesive is cured on the surfaces of the mounting electrodes 44 and 44. In the step described above, since the rigid resin, in particular, an epoxy-based or a polyimide-based resin, has a high adhesive strength to the gold surfaces of the mounting electrodes 44 and 44 and is also hard, the anchor members 41 are tightly fixed on the mounting electrodes 44 and 44.

Next, the mounting electrodes 44 and 44 of the package base 42 shown in FIGS. 1(a) and 1(b) or FIG. 3 are coated with the silicone-based conductive adhesives 15 and 15, respectively (ST14). As a result, a state shown in FIG. 5(b) is obtained.

Next, the piezoelectric resonator element 11 is mounted (ST15) on the mounting electrodes 44 and 44 coated with the silicone-based conductive adhesives 15 and 15, the package base 42 is placed in a heat curing oven, which is not shown in the figures, and the silicone-based conductive adhesives 15 and 15 are dried and cured (ST16), whereby tight bonding can be obtained.

Subsequently, when the piezoelectric resonator element 11 is sufficiently fixed on the mounting electrodes 44 and 44 with the silicone-based conductive adhesives 15 and 15 provided therebetween, a driving voltage from the external terminals 44a is carried to the mounting electrodes 44 and 44, via the conduction paths 44b, the driving voltage is applied to the piezoelectric resonator element 11 from the mounting electrodes 44 and 44, and while the oscillation frequency is monitored, the weights of the electrodes are reduced by, for example, irradiating laser light on the surface of the piezoelectric resonator element 11, whereby frequency adjustment is performed (ST17).

Next, the lid body, which is not shown in the figures, is placed on the package base 42, and sealing is performed by, for example, seam welding (ST18).

As described above, the piezoelectric resonator 40 is complete.

Since the first embodiment is thus constructed, and the piezoelectric resonator element 11 is bonded to the mounting electrodes 44 and 44 with the anchor members 41 and 41 provided therebetween using the silicone-based conductive adhesives 15 and 15, the adhesion of the silicone-based conductive adhesives 15 an 15 is performed by penetration thereof into the finely irregular surfaces or the rough surfaces of the anchor members 41 and 41 instead of conventional surfaces formed of gold having poor adhesion. In this case, when the adhesive strength is enhanced by penetration of the silicone resin into the fine irregularities of the anchor members 41 and 41, the electrical conductance is also enhanced because the silver filler contained in the resin simultaneously penetrates into the fine irregularities and the like.

Since the bonding of the piezoelectric resonator element 11 to the mounting electrodes 44 and 44 is performed by using the silicone-based conductive adhesives 15 and 15, when the piezoelectric resonator 40 is subjected to conditions of varying temperature, and when a difference in expansion and contraction between the piezoelectric oscillator 11 and the package base 42 is generated, the difference described above can be appropriately absorbed. Accordingly, there is no risk of degradation of characteristics, such as a change in frequency, an increase in CI (crystal impedance), or the like caused by a stress applied to the piezoelectric resonator element 11 due to the generation of the difference in expansion and contraction.

In addition, in the case in which the piezoelectric resonator 40 is mounted on a mounting substrate or the like, when a deforming effect caused by an external force is applied thereto and is transferred to the piezoelectric resonator element 11 via the adhesive, since the deforming effect is not directly transferred to the piezoelectric resonator element 11, the stress applying to the piezoelectric resonator element 11 can be prevented as is the case described above.

In addition, since the bonding of the piezoelectric resonator element 11 to the mounting electrodes 44 and 44 is performed by using the silicone-based conductive adhesives 15 and 15, and the silicone-based conductive adhesives 15 and 15 after curing are relatively soft, impact and vibration from the outside are absorbed therein and are not transferred to the piezoelectric resonator element 11, whereby a structure having superior impact resistance can be formed.

Furthermore, since the mounting electrodes 44 and 44 and the silicone-based conductive adhesives 15 are connected to each other by using the anchor members 41 and 41 formed of an epoxy-based or a polyimide-based conductive adhesive, the silicone-based conductive adhesives 15 and the mounting electrodes 44 and 44 can be reliably connected electrically to each other by the rigid resins. Accordingly, a driving voltage from the external terminals 44a can be reliably applied to the piezoelectric resonator element 11 from the anchor members 41 and 41 via the conduction paths 44b.

Second Embodiment

Next, a second embodiment of a piezoelectric oscillator to which the present invention is applied will be described.

Most of the features of the manufacturing steps described in the first embodiment are also equivalent to those of another device, i.e., the piezoelectric oscillator. That is, unlike the piezoelectric resonator, the piezoelectric oscillator has an integrated circuit mounted in the package base, and accordingly, the structure and the manufacturing steps thereof are slightly different from those of the piezoelectric resonator.

Figure 6:
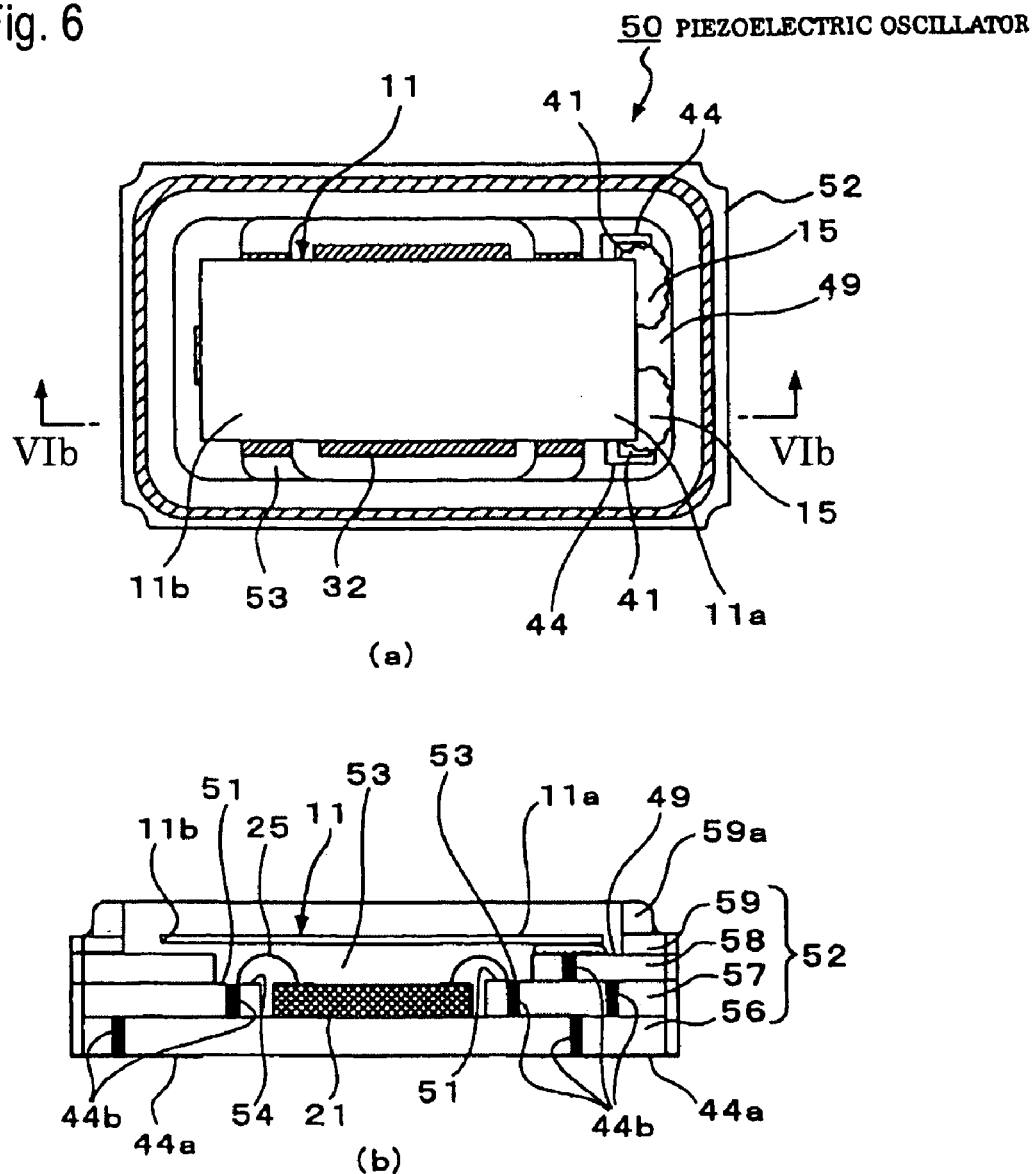

FIGS. 6(a) and 6(b) show a piezoelectric oscillator of the embodiment to which the present invention is applied, and for the convenience of understanding, a lid body is omitted in the figures. FIG. 6(a) is a plan view showing the interior of the piezoelectric oscillator by removing the lid body, and FIG. 6(b) is a schematic cross-sectional view showing the interior taken along plane VIb—VIb (shown in FIG. 6(a)) by removing the lid body.

In FIGS. 6(a) and 6(b), the same reference numerals of the elements of the piezoelectric resonator in the first embodiment and of the piezoelectric oscillator shown in FIGS. 12(a) and 12(b) designate elements of the piezoelectric oscillator equivalent thereto, descriptions thereof are omitted, and different points therebetween will be mainly described.

A piezoelectric oscillator 50 has a package base 52 in the form of a box in which a space portion 53 is formed to accommodate a piezoelectric resonator element 11 in the form of a plate. One end 11a of the piezoelectric resonator element 11 is fixed on two mounting electrodes 44 and 44, disposed on a step 49 formed in the space portion 53, by bonding using silicone-based conductive adhesives 15 and 15 provided therebetween, and the other end 11b is a free end.

The package base 52 is formed of four base materials 56, 57, 58, and 59 laminated with each other and a seam ring 59a placed thereon, the base material 56 at the bottom is a flat plate, and the base materials 57, 58, and 59 placed thereon are formed of ring-shaped or frame-shaped materials having inside diameters which are sequentially increased in this order.

Accordingly, the space portion 53 is formed in the package base 52 so that the piezoelectric resonator element 11 is to be accommodated therein, and in addition to the step 49 to which the piezoelectric resonator element 11 is bonded, a second step 51 is provided at an even lower position.

The mounting electrodes 44 and 44 on the step 49 have a structure equivalent to that in the first embodiment, and the mounting electrodes 44 and 44 are connected to conduction paths 44b passing through the laminated structure formed of the laminated base materials and are connected to electrodes 54 of the package base 42, respectively (described below).

Figure 7:
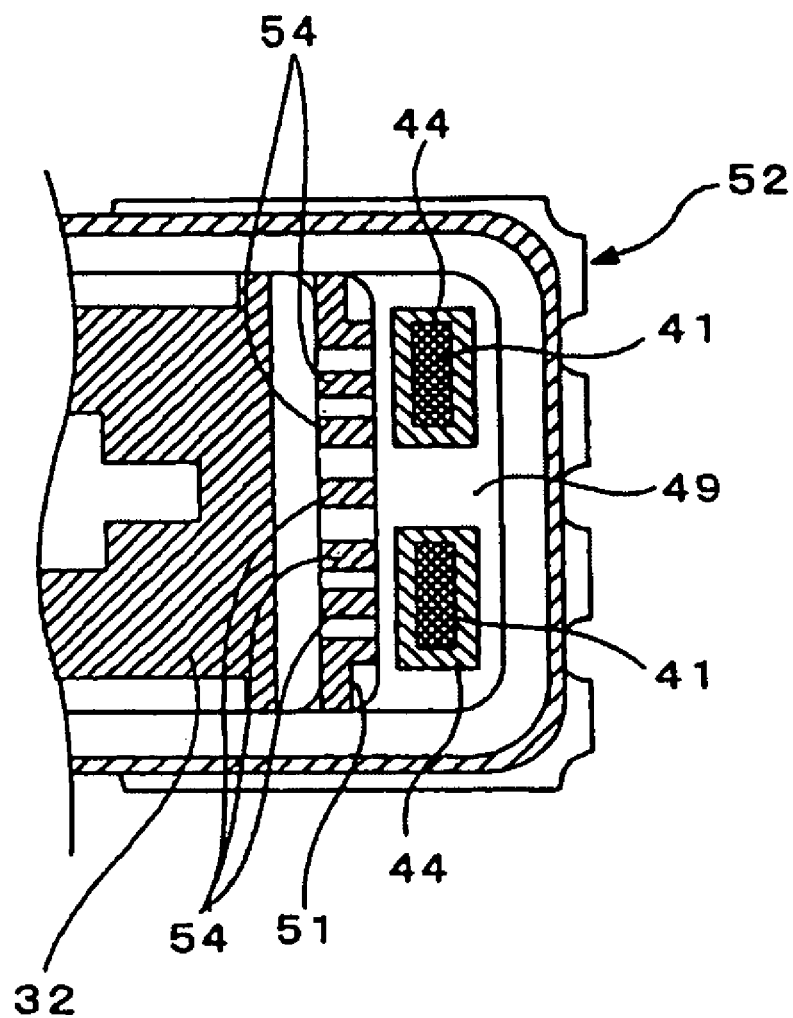
FIG. 7 is an expanded plan view showing the vicinity of mounting electrodes of a package base of the piezoelectric oscillator shown in FIGS. 6(a) and 6(b)
Figure 9:
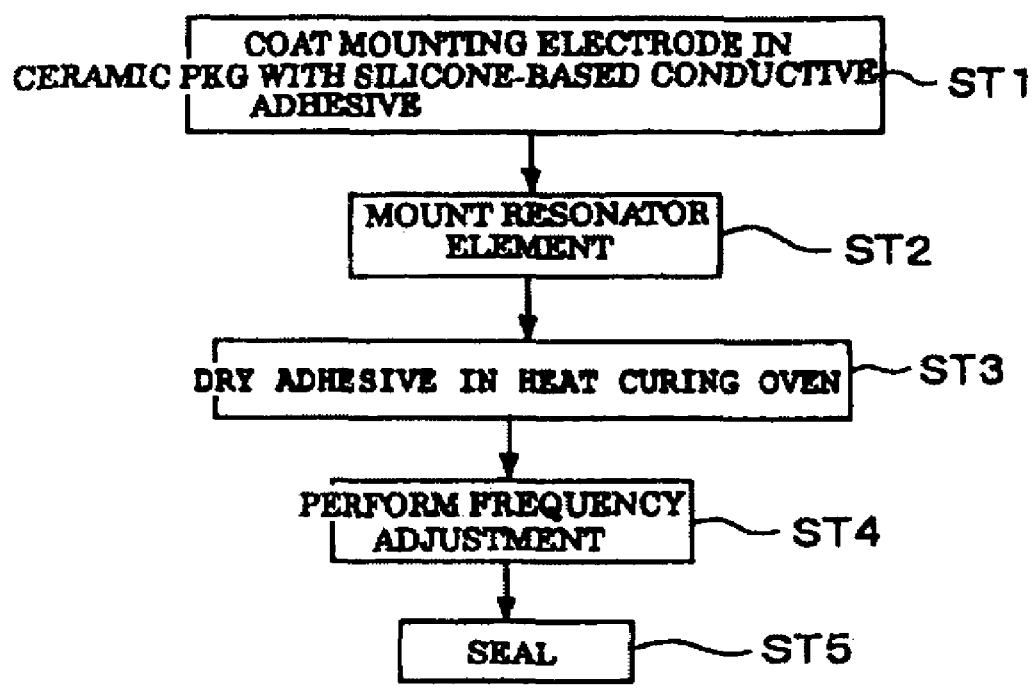
FIG. 9 is a flowchart generally showing manufacturing steps of the piezoelectric resonator shown in FIGS. 8(a) and 8(b)
Figure 10:
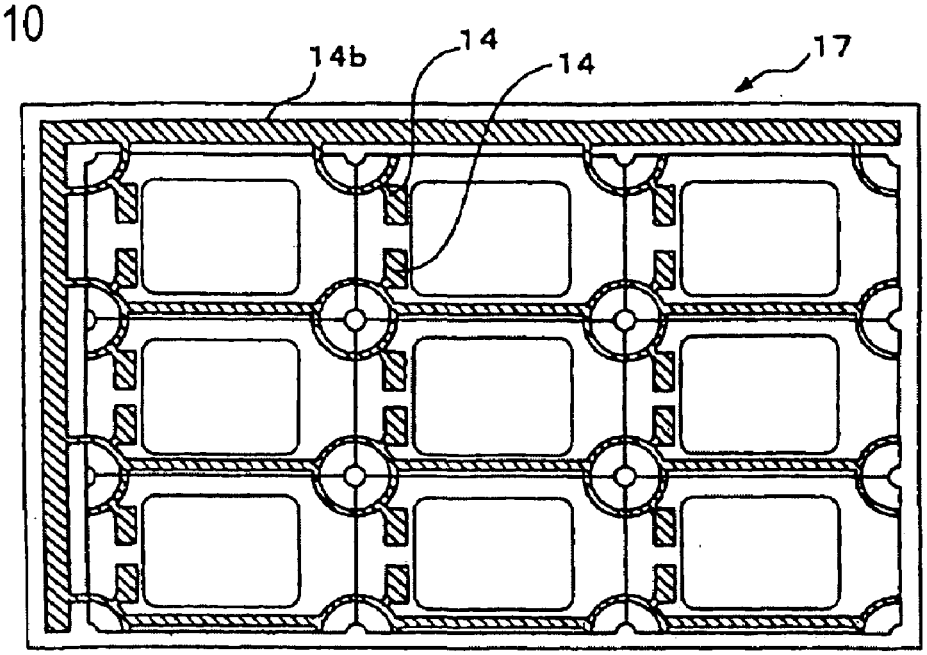
FIG. 10 is a plan view showing a green sheet including second base material layers each used for the piezoelectric resonator shown in FIGS. 8(a) and 8(b)
Figure 11:
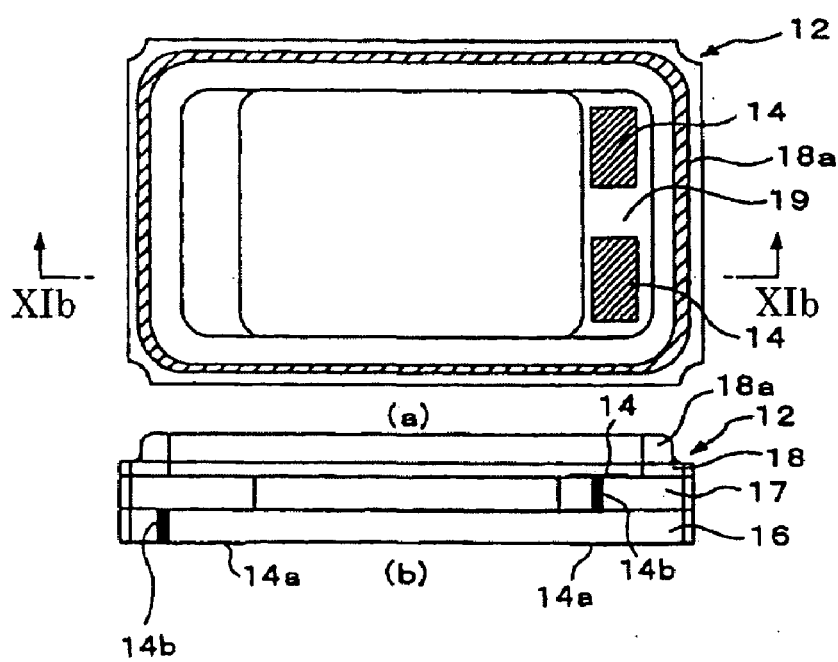

On the mounting electrodes 44 and 44, as shown in an expanded view in FIG. 7, anchor members 41 and 41 are provided, and manufacturing methods therefor and functions of the anchor members 41 and 41 are exactly equivalent to those described in the first embodiment.

Accordingly, a driving voltage applied from an integrated circuit 21 (described below) is carried to the mounting electrodes 44 and 44, via the conduction paths 44b, and in addition, the driving voltage is applied to the piezoelectric resonator element 11 from the silicone-based conductive adhesives 15 and 15. As a result, the piezoelectric resonator element 11 oscillates at a predetermined frequency.

In addition, on the bottom inside the package base 52, the integrated circuit 21 is mounted, and on the step 51, the plurality of electrodes 54 are formed which are to be wire-bonded to the integrated circuit 21 by gold wires 25. In addition, as shown in FIG. 7, on the bottom surface inside the package base 52, an electrode 32 that mounts the integrated circuit 21 thereon is provided. Manufacturing methods for these electrodes are equivalent to those described in the piezoelectric resonator 40.

Accordingly, in the piezoelectric oscillator 50, a driving voltage applied from the integrated circuit 21 is applied to electrodes formed on the surface of the piezoelectric resonator element 11, via the mounting electrodes 44 and 44, the piezoelectric resonator element 11 is oscillated at a predetermined frequency, and in addition, the output signal therefrom is inputted in the integrated circuit 21, whereby an external signal at a predetermined frequency can be obtained.

Manufacturing of the piezoelectric oscillator 50 has only one extra step of mounting the integrated circuit 21 prior to ST12 of the manufacturing steps of the piezoelectric resonator described in FIG. 2, and the other steps are equivalent to those in FIG. 2.

Since the second embodiment is thus constructed, and the structures of the mounting electrodes 44 and 44 and the structures of the anchor members 41 and 41 are the same as those described above, the same advantages as those obtained in the first embodiment can be obtained.

The present invention is not limited to the embodiments described above.

The present invention can be applied to, in addition to piezoelectric resonators and piezoelectric oscillators, various piezoelectric devices using piezoelectric resonator elements.

In addition, for example, the order of the manufacturing steps can be changed, and furthermore, the individual conditions and structures described in the embodiments may be partly omitted optionally, or they may be combined with each other.

As described above, according to the present invention, a piezoelectric device can be provided having a structure which resists impact from the exterior of the device, and stress applied to the piezoelectric resonator element, and which can enhance the electrical conductance between the electrode side of the package base and the piezoelectric resonator element, and a manufacturing method therefor can be provided.

What is claimed is:

1. A piezoelectric device having a structure in which a piezoelectric resonator element is bonded to electrodes provided on a package base, comprising:

silicone-based conductive adhesives;

mounting electrodes provided on the package base, to which a driving voltage is carried via conduction paths, and on which the piezoelectric resonator element is mounted, the mounting electrodes defining surfaces; and conductive anchor members which are disposed on the surfaces of the mounting electrodes and which are formed of a material having high adhesion to the surfaces of the mounting electrodes, the piezoelectric resonator element being bonded to the conductive anchor members with the silicone-based conductive adhesives provided therebetween, wherein the conductive anchor members include a conductive adhesive formed of a rigid resin.

2. The piezoelectric device according to claim 1, the conductive anchor members including at least one of an epoxy-based and a polyimide-based conductive adhesive.

3. The piezoelectric device according to claim 1, wherein the surface of the mounting electrode is a gold (Au) electrode film.

* * * * *